United States Patent

[11] 3,551,695

[72] Inventor William R. Fowler
Scottsdale, Ariz.

[21] Appl. No. 687,068
[22] Filed Nov. 30, 1967
[45] Patented Dec. 29, 1970
[73] Assignee Motorola, Inc.
Franklin Park, Ill.
a corporation of Illinois

[54] BIPOLAR DIFFERENTIAL DISCRIMINATOR
10 Claims, 8 Drawing Figs.

[52] U.S. Cl. .......... 307/235, 307/236: 330/30, 330/69
[51] Int. Cl. .......... H03k 5/20
[50] Field of Search .......... 307/235, 236; 330/30D, 69

[56] References Cited
UNITED STATES PATENTS

| | | | |
|---|---|---|---|
| 3,168,708 | 2/1965 | Stuart-Williams | 330/69X |
| 3,170,125 | 2/1965 | Thompson | 330/30X |
| 3,413,492 | 11/1968 | Schneider | 307/235 |

*Primary Examiner*—John S. Heyman
*Attorney*—Mueller & Aichele

ABSTRACT: Disclosed is a bipolar differential discriminator and a system in which the discriminator is used. In the discriminator, first and second differentially connected input transistors are connected in cascade respectively with first and second discriminating transistors for driving same when the differential signal at the input transistors reaches a predetermined level. The discriminating transistors are connected to a common current output point and to a strobe gate containing one or more gating transistors. These gating transistors are differentially switched against a reference transistor when strobe signals applied thereto reach a certain level. The strobe signals enable the gating transistors to conduct and provide a current path from the discriminating transistors when the differential signals applied to the first and second input transistors reach the predetermined level.

INVENTOR.
William R. Fowler

BY Mueller, Aichele & Rauner

ATTY'S.

INVENTOR.
William R. Fowler

BY

Mueller, Aichele & Rauner

ATTY'S.

BIPOLAR DIFFERENTIAL DISCRIMINATOR

BACKGROUND OF THE INVENTION

This invention relates generally to amplitude discriminators and more particularly to a strobed, DC coupled differential discriminator operative in the current mode to discriminate bipolar input signals. Prior art circuitry for discriminating bipolar signals requires one circuit to discriminate positive voltage signals and another circuit to discriminate negative voltage signals. Additionally, the prior art differential discriminator circuit typically uses a common mode input and does not reject common mode noise or drift. These prior art circuits do not lend themselves to strobing, and the strobing function can only be performed either before or after the incoming signal is discriminated. The fact that the prior art circuits have common mode inputs is further disadvantageous in that the discriminator cannot take full advantage of the differential amplifier gain which normally drives the discriminator circuit. To summarize, prior to this invention there was not available a differential discriminator capable of discriminating against bipolar signals, which could be strobed during the discriminating function, which used only a single discriminating circuit with a minimum number of components to discriminate bipolar signals and which was DC coupled.

SUMMARY OF THE INVENTION

An object of this invention is to provide a new and improved discriminator circuit operative to discriminate both positive and negative voltage signals.

Another object of this invention is to provide a differential discriminator which operates independently of common mode noise and common mode bias conditions.

Another object of this invention is to provide a discriminator capable of taking full advantage of the differential gain of a differential amplifier used to drive the discriminator.

Another object of this invention is to provide a strobed differential discriminator circuit having a minimum number of components and which easily incorporates strobe circuitry.

The present invention features a DC coupled, differential discriminator having first and second differential inputs connectable respectively to first and second outputs of a differential amplifier. The discriminator operates in the current mode to drive an output gate, and the output gate shifts the DC levels to the discriminator to a current mode logic (CML) level.

Another feature of this invention is a provision of a discriminator which includes first and second discriminating transistors connected in cascade, respectively, with first and second input transistors and alternately biased into conduction when the differential signals applied to the first and second input transistors reaches a predetermined level.

Another feature of this invention is a system implementation for the discriminator which includes, in addition to the above-described circuitry, a bias driver circuit for establishing a reference voltage which is applied to a reference transistor in the discriminator. Strobe gating transistors are differentially switched against this reference transistor to enable the discriminator for conduction.

The above objects and features will become more fully understood from the following description of the accompanying drawings wherein:

Briefly described, this invention includes a differential discriminator having first and second input emitter follower transistors connected in cascade respectively to first and second discriminating transistors. The discriminating transistors are connected to an output terminal for controlling the current therethrough in accordance with the level of the differential signals applied to the first and second input transistors. A strobe gate including at least one gating transistor is connected to the first and second discriminating transistors and enables the latter for conduction when a strobe signal applied to the strobe gate reaches a predetermined level. The differential discriminator output terminal is typically connected to an output gate circuit which shifts the DC level at the output terminal to a current mode logic level. The first and second input transistors are adapted to be DC coupled to transistors in a previous differential amplifier stage so that the discriminator takes full advantage of the differential amplifier gain.

DESCRIPTION OF THE PREFERRED EMBODIMENTS

Figure 1:
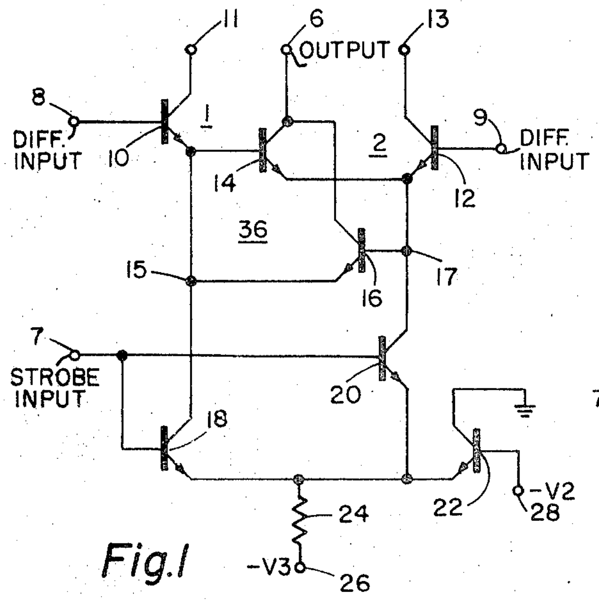
FIG. 1 is a schematic diagram of one circuit embodiment of the invention.

Referring in detail to the drawings, FIG. 1 shows a discriminator stage 36 having first and second input emitter follower transistors 10 and 12 connected in cascade, respectively, with first and second discriminating transistors 14 and 16. The discriminating transistors 14 and 16 are connected to a single output terminal 6 and to the collectors of second and first gating transistors 20 and 18 respectively. The first gating transistor 18 is connected to a first junction 15 between the first input transistor 10 and the second discriminating transistor 16, and the second gating transistor 20 is connected to the common junction 17 between the first discriminating transistor 14 and the second input transistor 12.

DESCRIPTION OF OPERATION OF FIG. 1

When the differential signal level between input terminals 8 and 9 is sufficient to cause the emitters of either transistor 14 or transistor 16 to be forward biased, then one of these latter transistors will conduct current through the gating transistors 18 and 20 provided that the latter transistors are biased for conduction by a strobe signal applied to the strobe input terminal 7. The gating transistors 18 and 20 are differentially switched against a reference transistor 22 to which a reference potential $-V_2$ is applied at terminal 28. Transistors 18 and 20 are resistively connected to a voltage supply $-V_3$ at terminal 26. Current will flow from terminal 6 into the collector of one of the discriminating transistors 14 or 16 if the following conditions exist: (1) the differential mode signal (of either polarity) applied to the input terminals 8 and 9 must be of sufficient voltage amplitude to cause the emitter-base junction of either transistor 14 or transistor 16 to conduct. (2) In addition, the voltage amplitude of the strobe signal at input terminal 7 relative to $-V_2$ must be such that the gating transistors 18 and 20 are forward biased. When these conditions exist, a current path is completed through resistor 24 to the negative power supply $-V_3$. The value of current flowing into terminals 15 or 17 depends upon the relative forward bias between transistors 10 and 16 in the case of input terminal 8 being more positive than input terminal 9 and upon the relative forward bias between transistors 12 and 14 in the case of input terminal 9 being more positive than input terminal 8. Since the current through resistor 24 is shared by the gating transistors 18 and 20, the maximum value of current flowing through the output terminal 6 will not exceed approximately one-half of the value of current through resistor 24.

When the gating transistors 18 and 20 are forward biased and the differential level of signals applied to input terminals 8 and 9 is not of sufficient magnitude to forward bias either transistor 14 or transistor 16, the gating transistors 18 and 20 will conduct current directly from the emitters of the input transistors 10 and 12. However, if a differential voltage applied to terminals 8 and 9 is sufficient in magnitude to forward bias one of the discriminating transistors 14 and 16, and the voltage level at the strobe input terminal 7 is insufficient to overcome the reference voltage $-V_2$ applied to the reference transistor 22, then the discriminator 36 is disabled and current is only conducted from ground through the reference transistor 22 and resistor 24 to the negative supply voltage $-V_3$.

Figure 2:
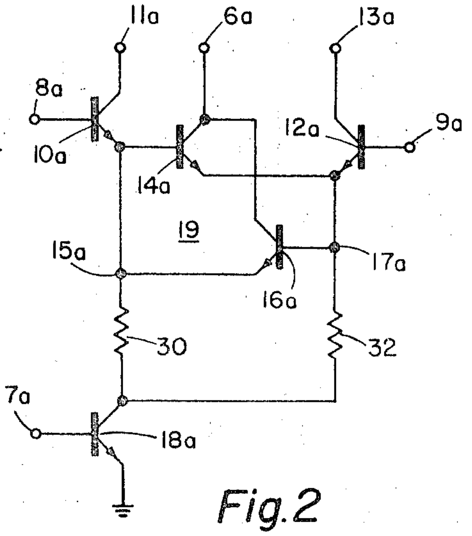
FIG. 2 is a schematic diagram of an alternative circuit embodiment according to this invention.

In another embodiment of the invention which is illustrated in schematic in FIG. 2, the strobe gate consists of a single NPN transistor 18*a* having its base connected to a strobe input terminal 7*a*. First and second resistors 30 and 32 are connected respectively between the collector of the gating transistor 18*a* and junctions 15*a* and 17*a* as shown. Transistors 10*a*, 12*a*, 14*a*, and 16*a* function identically as transistors 10, 12, 14, and 16 in FIG. 1. In FIG. 2 the strobe voltage applied to terminal 7*a* must exceed the $V_{BE}$ of the gating transistor 18*a* to forward bias the latter for conduction when either transistor 14*a* or transistor 16*a* forward biased for conduction.

Figure 3:
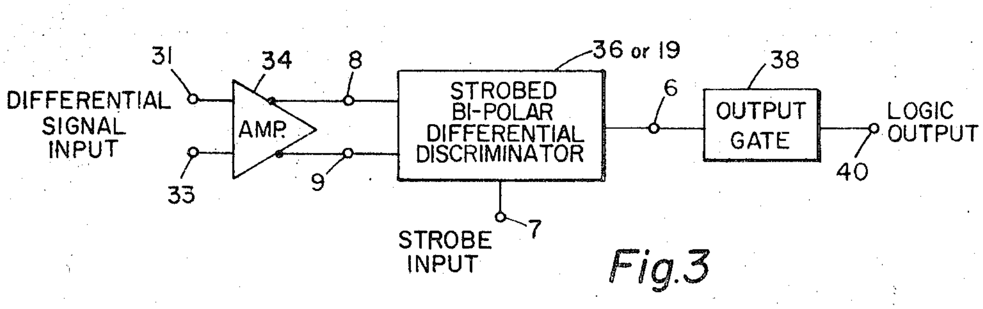
FIG. 3 is a block diagram of a system implementation of the present invention.

Either of the discriminators 36 or 19 in FIG. 1 and 2, respectively, may be used in the system illustrated in FIG. 3. This system includes an input differential amplifier 34 having input terminals 31 and 33 connected to receive an input signal and output terminals connected directly to the discriminator terminals 8 and 9. The output terminal 6 of the discriminator is connected directly to an output gate 38 which is described below. An output signal (see FIG. 4*d*) for the system is derived at output terminal 40.

Figures 4A, 4B, 4C, 4D:
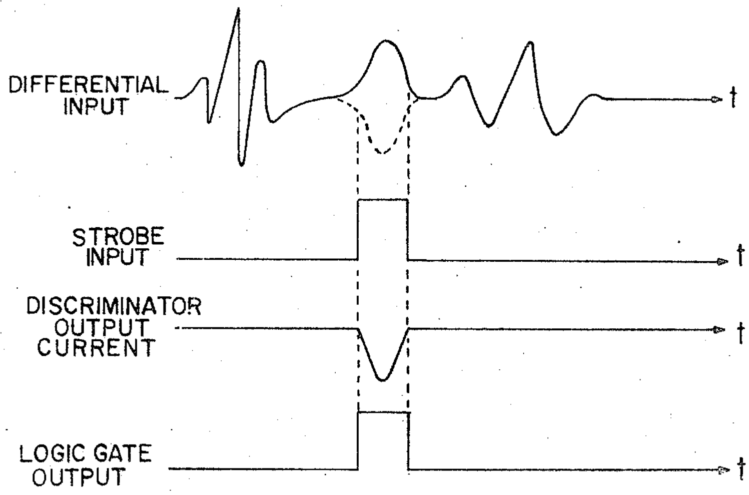
FIG. 4 illustrates signal waveforms at various points in the system shown in FIG. 3

The waveforms in FIG. 4 illustrate the function of the system in FIG. 3, and the differential input signal in FIG. 4*a* represents the differential voltage level between terminals 31 and 33 in FIG. 3. When the strobe input signal in FIG. 4*b* is applied to terminal 7 of the bipolar discriminator 36, output current (see FIG. 4*c*) will flow into the collectors of transistors 14 or 16 and produce a corresponding change in signal level at the output terminal 40 of the output gate. This output signal is the logic pulse shown in FIG. 4*d*. The waveforms in FIG. 4*c* and 4*d* will be better understood in the following description of the circuit operation of the output gate circuit 38 which is illustrated in schematic in FIG. 5.

Figure 5:
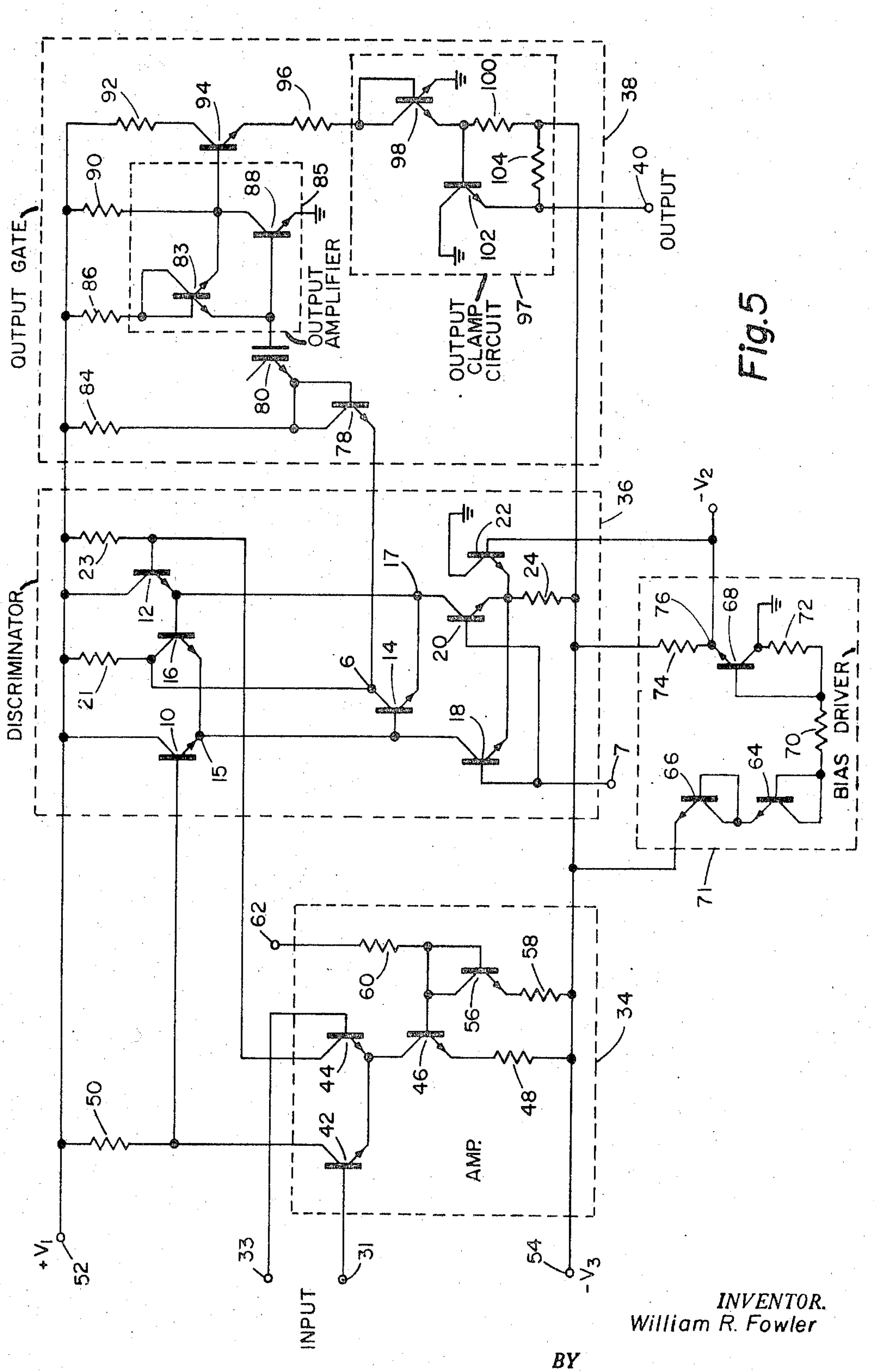
FIG. 5 is a complete circuit schematic for the system shown in FIG. 3.

The system in FIG. 5 includes an input differential amplifier stage 34 having emitter coupled transistors 42 and 44 connected to a current sink transistor 46. The current sink transistor 46 is connected to a reference voltage at terminal 62 and has a temperature compensating diode 56 connected in the base circuit thereof. The collectors of emitter coupled transistors 42 and 44 are connected via resistors 50 and 23 to the positive supply $V_1$ at terminal 52, and these collectors are tied directly to the bases of the first and second input transistors 10 and 12 of the differential discriminator 36. Some of the reference numerals in FIG. 5 correspond identically to those in FIG. 1 and the differential discriminator 36 will not be further described with reference to FIG 5.

A bias driver circuit 71 including diodes 64, 66 and transistor 68 is connected between the negative supply $-V_3$ at terminal 54 and ground potential, and a reference bias voltage is derived at node 76 in the bias driver circuit 71. The bias driver circuit 71 is a current node bias driver circuit and a modification of the Motorola MECL bias driver. A bias voltage which corresponds to the mean logic voltage level of signals applied to the gating transistors 18 and 20 in the discriminator stage is generated at node 76 in circuit 71. Resistors 70, 74 and diodes 64 and 66 provide a bias at the base of emitter-follower transistor 68, and diodes 64 and 66 provide temperature compensation within the bias driver circuit 71. The emitter-follower 68 is biased conductive by current through resistor 74.

The output terminal 6 of the discriminator stage 19 or 36 is connected to diode 78 in the output stage 38, and diode 78 is serially connected to a capacitor 80. Capacitor 80 is formed by the emitter-base junction of the NPN transistor connected to the base of diode 78 in the output gate.

An output amplifier 85 is connected to the capacitor 80 and includes a double emitter diode 83 and a transistor 88 which is connected directly to the base of transistor 94. Transistor 88 is biased conductive, but is clamped out of saturation by the diode 83. A level shifting resistor 96 connects the emitter of transistor 94 to an output clamp circuit 97 which includes a double emitter diode 98 connected to the base of an output emitter-follower 102.

DESCRIPTION OF OPERATION OF OUTPUT GATE 38

In the quiescent condition of the system shown in FIG. 5, transistors 14 and 16 are nonconducting and the capacitor 80 is in a charged condition. The double emitter diode 83 in the output amplifier 85 clamps the collector of transistor 88 at its base voltage, i.e., one $V_{BE}$ above ground potential. The emitter of transistor 94 is now at approximately ground potential and the output terminal 40, which is down two diode drops ($2_{BE}$) below ground, is at approximately −1.6 volts. This voltage is the lower of the two discrete MECL or current mode logic levels presently used.

A transient condition in the system of FIG. 5 exists when a differential signal is applied to the discriminator 36, and turns on transistors 14 and 16. The capacitor 80 is now discharged by current flowing into terminal 6, discharging the base of transistor 88 and turning the latter off. When transistor 88 turns off, the base of transistor 94 swings high and transistor 94 conducts through diode 98 to ground. When diode 98 conducts, the base of emitter-follower transistor 102 swings to approximately ground potential and the output voltage level at output terminal 40 swings from approximately −1.6 volts to −0.8 volts, the higher of the two current-mode logic levels. Capacitor 80 provides a voltage shift in the output gate, and the output gate amplifies and converts the discriminator signal to a digital, current-mode logic signal compatible with MECL current-mode logical levels presently used.

Listed below are resistance and voltage values used in a system of FIG. 5 which has been actually built and successfully tested. However, this table should not be construed as limiting the scope of this invention.

TABLE

| Resistors: | | Values |
|---|---|---|
| R 48 | ohms | 330 |
| R 50 | do | 1, 100 |
| R 21 | do | 10, 000 |
| R 23 | do | 1, 100 |
| R 24 | do | 700 |
| R 58 | do | 330 |
| R 60 | do | 1, 200 |
| R 70 | do | 2, 250 |
| R 72 | do | 300 |
| R 74 | do | 2, 000 |
| R 84 | do | 3, 000 |
| R 86 | do | 10, 000 |
| R 90 | do | 2, 000 |
| R 92 | do | 2, 000 |
| R 96 | do | 200 |
| R 100 | do | 6, 000 |
| R 104 | do | 200 |
| +V1 | volts | +5 |
| −V2 | do | −1. 15 |
| −V3 | do | −5. 2 |

I claim:

1. A bipolar differential discriminator including in combination:

first and second differentially coupled input transistors each having a pair of main electrodes and a control electrode;

means to apply signals to the inputs of said first and second transistors;

third and fourth discriminating transistors each having a pair of main electrodes and a control electrode;

means for connecting a main electrode of each of said first and second transistors to the control electrode of a respective one of said third and fourth transistors;

means for connecting said main electrodes of said first and second transistors to a main electrode of a respective one of said fourth and third transistors;

means for connecting said other main electrodes of said third and fourth transistors to an output terminal; and means for applying a strobe voltage to said main electrodes of said first and second transistors.

2. A bipolar differential discriminator including, in combination:

first and second input transistors adapted to be differentially coupled to a source of bipolar differential input signals;

first and second discriminating transistors connected respectively, to said first and second input transistors and further connected to an output terminal, the voltage level at said output terminal varied in proportion to the differential signal level at said first and second input transistors; and a strobe gate connected to said input transistors and to said discriminating transistors and adapted to receive a strobe signal for enabling said discriminator to conduct and provide an output signal at said output terminal.

3. The discriminator as defined in claim 2 wherein:

said strobe gate includes first and second gating transistors differentially coupled to a reference transistor, said first gating transistor connected to a first current output junction of said first input transistor and said second discriminating transistor; and said second gating transistor connected to a second current output junction of said second input transistor and said first discriminating transistor, the current through said output terminal being controlled by the difference in forward bias applied to said first input transistor and said second discriminating transistor when said first input transistor is conducting and being controlled by the difference in forward bias applied to said second input transistor and to said first discriminating transistor when said second input transistor is conducting.

4. The discriminator defined in claim 3 wherein said first gating transistor conducts emitter current from said second discriminating transistor when the emitter base junction of said second discriminating transistor is forward biased, and said second gating transistor conducts emitter current from said first discriminating transistor when the emitter base junction of said first discriminating transistor is forward biased, said first and second gating transistors connected to a single strobe input and switched against said reference transistor so that said gating transistors conduct only when the strobe signal applied thereto exceeds a bias potential applied to said reference transistor.

5. The discriminator as defined in claim 2 wherein said strobe gate comprises a single gating transistor connected in a common path of current for said transistors so that said discriminator is enabled for conduction only when the strobe signal applied to said single gating transistor exceeds the offset voltage of said single gating transistor.

6. The discriminator as defined in claim 5 wherein first and second resistors are connected in said common current path including said single gating transistor for limiting current flowing into said single gating transistor.

7. A system for differentially discriminating bipolar signals including, in combination:

an input differential amplifier stage including first and second differentially coupled transistors having first and second outputs respectively;

a differential amplitude discriminator stage having first and second transistors connected to said first and second outputs of said differential amplifier said first and second discriminating transistors having first and second outputs respectively, the outputs of said first and second discriminating transistors being connected respectively to the output of said second and first input transistors, said discriminating transistors connected to a common output terminal, said first discriminating transistor providing an output current proportional to the relative forward bias between said input transistor and said first discriminating transistor and said second discriminating transistor providing an output current proportional to the relative forward bias between said first input transistor and said second discriminating transistor; and a strobe gate including at least one gating transistor which is connectable to a source of strobe signals and connected to said first and second discriminating transistors, said gating transistor operative to be biased into conduction and enable conduction in said discriminator when strobe signals applied to said gating transistor reach a predetermined level.

8. The discriminator defined in claim 7 wherein said strobe gate includes a second gating transistor coupled to said one gating transistor and further differentially connected to a reference transistor, said one and second gating transistors connected to a common source of strobe signals and differentially switched against said reference transistors to enable said first or second discriminating transistors to conduct in response to differential signals at said first and second outputs of said differential amplifier stage, said first and second outputs DC coupled to said first and second input transistors in said discriminator stage.

9. The system as defined in claim 8 which includes an output gate coupled to said output terminal of said discriminator stage, said output gate includes a diode connected in a series with a capacitor, a clamp connected to said capacitor and conductively controlled thereby and an output emitter-follower DC coupled to said clamp and providing output current mode logic voltage levels at the output thereof.

10. A system as defined in claim 9 which further includes a level shifting transistor connected to the output of said clamp and a diode connected between said level shifting transistor and said output emitter-follower.